United States Patent [19]
Suto

[11] Patent Number: 6,008,672
[45] Date of Patent: Dec. 28, 1999

[54] INPUT SIGNAL READING CIRCUIT HAVING A SMALL DELAY AND A HIGH FIDELITY

[75] Inventor: Shinichi Suto, Tokyo, Japan

[73] Assignee: NEC Corporation, Tokyo, Japan

[21] Appl. No.: 08/967,698

[22] Filed: Nov. 10, 1997

[30] Foreign Application Priority Data

Nov. 11, 1996 [JP] Japan ..................................... 8-298526

[51] Int. Cl.⁶ ................................................. H03K 9/08
[52] U.S. Cl. ............................................. 327/34; 327/18
[58] Field of Search .......................... 377/28, 45; 327/20, 327/21, 34, 18, 26, 37

[56] References Cited

U.S. PATENT DOCUMENTS

| | | | |
|---|---|---|---|
| 3,629,710 | 12/1971 | Durland | 327/175 |
| 3,836,858 | 9/1974 | Kitano | 327/115 |
| 4,375,084 | 2/1983 | Urushibata | 364/900 |
| 4,502,024 | 2/1985 | Nishikawa | 332/109 |
| 4,502,117 | 2/1985 | Kihara | 364/200 |
| 4,667,338 | 5/1987 | Toyonaga et al. | 377/45 |
| 4,805,199 | 2/1989 | Muramatsu | 377/39 |
| 5,043,653 | 8/1991 | Foster et al. | 322/32 |

FOREIGN PATENT DOCUMENTS

| | | |
|---|---|---|
| 0 343 317 | 11/1989 | European Pat. Off. . |
| 57-87232 | 5/1982 | Japan . |

Primary Examiner—Timothy P. Callahan
Assistant Examiner—Anh-Quan Tra
Attorney, Agent, or Firm—Scully, Scott, Murphy & Presser

[57] ABSTRACT

An input signal reading circuit includes an up-down counter receiving an input signal and a sampling clock to count up the samplig clock when the input signal is at a high level and to count down the sampling clock when the input signal is at a low level. The up-down counter outputs an underflow signal when a count value of the up-down counter becomes zero. A comparator compares the count value of the up-down counter with a reference value held in a register, to generate a coincidence signal when the count value of the up-down counter becomes coincident with the reference value. A RS flipflop is set by the coincidence signal to bring the read-out signal into a high level, and is reset by the underflow signal to bring the read-out signal into a low level.

4 Claims, 5 Drawing Sheets

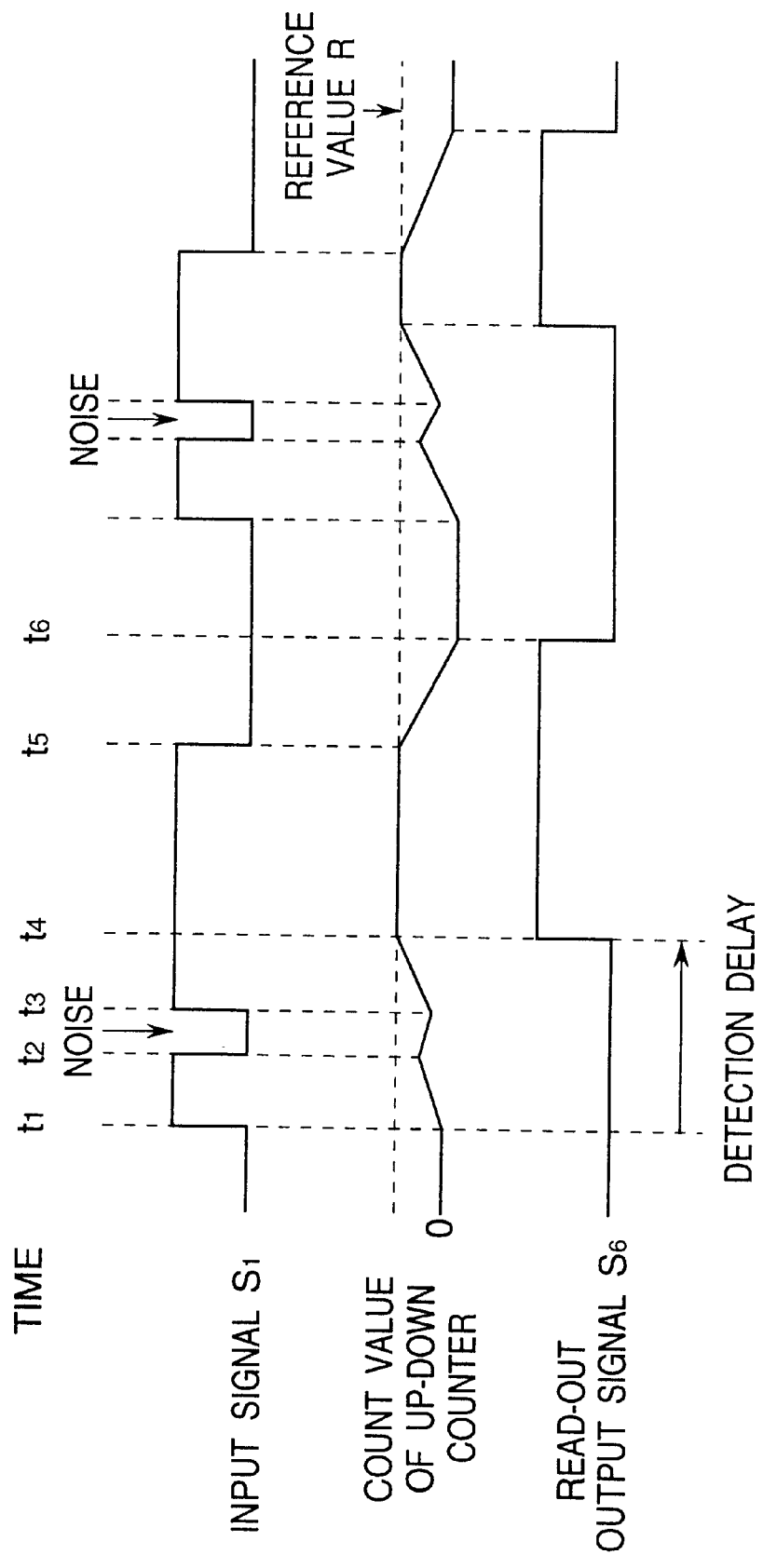

INPUT SIGNAL READING CIRCUIT HAVING A SMALL DELAY AND A HIGH FIDELITY

BACKGROUND OF THE INVENTION

1. Field of the invention

The present invention relates to an input signal reading circuit, and more specifically to an input signal reading circuit for stably reading a noisy input signal with a small amount of delay and a high degree of fidelity.

2. Description of related art

Japanese Patent Application Pre-examination Publication No. JP-A-57-087232 (the content of the which is incorporated by reference in its entirety into this application, and also an English abstract of JP-A-57-087232 is available from the Japanese Patent Office and the content of the English abstract of JP-A-57-087232 is also incorporated by reference in its entirety into this application) discloses one typical prior art input signal reading circuit, which will be now described with reference to FIGS. 1 and 2. FIG. 1 is a simplified block diagram of the prior art input signal reading circuit disclosed in JP-A-57-087232, and FIG. 2 is a timing chart illustrating an operation of the prior art input signal reading circuit disclosed in JP-A-57-087232.

As shown in FIG. 1, the prior art input signal reading circuit disclosed in JP-A-57-087232 includes an integral counter, namely, an up counter 5 for sample-counting an input signal $S_1$, and a timing pulse generator 6 for generating a sampling clock and a read timing pulse $S_8$. The up counter 5 is controlled by the input signal $S_1$ to count the sampling clock only when the input signal $S_1$ is at a high level, and to output a signal $S_7$ of a high level when a count value of the up counter 5 is equal to or larger than a predetermined constant value (threshold value) preset in the up counter itself. When the count value of the up counter 5 is smaller than the predetermined constant value, namely, when the count value of the up counter 5 has not yet reached the predetermined constant value, the up counter 5 outputs the signal $S_7$ of a low level. When the read timing pulse $S_8$ is generated by the timing pulse generator 6, the up counter 5 is reset or cleared, to re-start a count-up from an initial value. On the other hand, a D-type flipflop 7 latches the signal $S_7$ at each time the read timing pulse $S_8$ is generated, and a Q output of the D-type flipflop 7 is outputted as a read-out output signal $S_9$ of the input signal $S_1$.

Thus, by appropriately selecting the frequency of the sampling clock and a period of the read timing pulse $S_8$, a noise contained in the input signal $S_1$ is removed as shown in the timing chart of FIG. 2.

As seen from the timing chart of FIG. 2, the prior art input signal reading circuit is constructed to detect, in synchronism with the read timing pulse $S_8$, whether or not the count value of the up counter 5 reaches the predetermined constant value, namely, whether or not the up counter 7 outputs the output signal $S_7$ of the high level. Furthermore, the up counter 5 is reset in synchronism with the read timing pulse $S_8$, namely, at the period of the read timing pulse $S_8$. Therefore, although the count value of the up counter 5 has already reached the predetermined constant value, the high level output signal of the up counter 5 is not detected unless the read timing pulse $S_8$ is outputted In addition, since advancement of the counting is delayed by the low level noise, if the count value of the up counter 5 does not reach the predetermined constant value until the read timing pulse $S_8$ is outputted, the count value of the up counter 5 is reset, so that the high level output signal of the up counter 5 is not detected. As a result, the detection timing is significantly delayed, as shown in a left half of FIG. 2, and in extreme case, although a high level input signal is received, it is not possible to detect the input signal, as shown in a right half of FIG. 2.

SUMMARY OF THE INVENTION

Accordingly, it is an object of the present invention to provide an input signal reading circuit which has overcome the above mentioned defect of the conventional one.

Another object of the present invention is to provide an input signal reading circuit capable of stably reading a noisy input signal with a small amount of delay and a high degree of fidelity.

The above and other objects of the present invention are achieved in accordance with the present invention by an input signal reading circuit comprising an up-down counter receiving an input signal and a sampling clock to count up the sampling clock when the input signal is at an active level and to count down the sampling clock when the input signal is at an inactive level, the up-down counter outputting an underflow signal when a count value of the up-down counter becomes an initial value;

a register for holding a reference value;

a comparator comparing the count value of the up-down counter with the reference value of the register, to generate a coincidence signal when the count value of the up-down counter becomes coincident with the reference value of the register; and an output circuit receiving the underflow signal and the coincidence signal for outputting a read-out signal, the output circuit responding to the coincidence signal to bring the read-out signal into a first level and responding to the underflow signal to bring the read-out signal into a second level different from the first level.

With the above mentioned arrangement, the up-down counter counts down when the input signal of the inactive level (for example, a low level) is received. When a noise is inputted instantaneously, the up-down counter counts down, however, the noise cannot be considered to continue for a long time. Therefore, if the input signal of the active level (for example, a high level) is received in a general situation, the counter finally reaches the reference value. As soon as the count value of the up-down counter reaches the reference value, the read-out signal is brought into a first level (for example, a high level). Namely, it is regarded that the active level of the input signal is detected. If the inactive level of the input signal truly continues to be received, the up-down counter continues to count down, and therefore, the active level of the input signal is never detected.

In order that the moment the count value of the up-down counter has reached the reference value is deemed to be the moment the active level of the input signal has been detected, it is necessary to count down when the inactive level of the input signal is received. If the counter is not counted down, when the active level of the input signal is received at intervals, the active level of the input signal is detected. Therefore, in order to avoid this inconvenience, any resetting means would become necessary. In the present invention, this inconvenience is avoided by counting down the up-down counter when the inactive level of the input signal is received.

The above and other objects, features and advantages of the present invention will be apparent from the following description of preferred embodiments of the invention with reference to the accompanying drawings.

BRIEF DESCRIPTION OF THE DRAWINGS

FIG. 4 is a timing chart illustrating an operation of the input signal reading circuit shown in FIG. 3;

DESCRIPTION OF THE PREFERRED EMBODIMENTS

Figure 3:
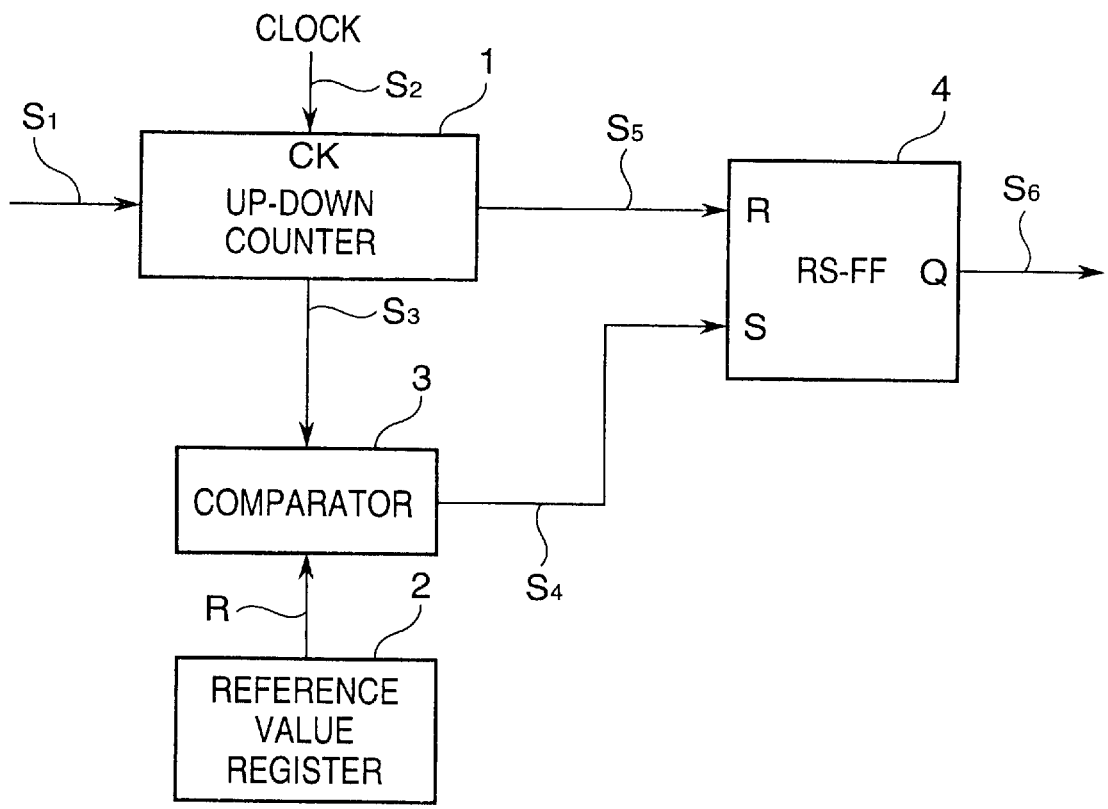
FIG. 3 is a block diagram of a first embodiment of the input signal reading circuit in accordance with the present invention.

Referring to FIG. 3, there is shown a block diagram of a first embodiment of the input signal reading circuit in accordance with the present invention.

The first embodiment of the input signal reading circuit includes an up-down counter 1 receiving an input signal $S_1$ and a sampling clock $S_2$ to count up the sampling clock $S_2$ when the input signal $S_1$ is at a high level and to count down the sampling clock $S_2$ when the input signal $S_1$ is at a low level. This up-down counter 1 outputs an underflow signal $S_5$ when a count value of the up-down counter 1 becomes an initial value such as 0 (zero). The shown input signal reading circuit also includes a register 2 for holding a reference value R, and a comparator 3 comparing the count value $S_3$ of the up-down counter 1 with the reference value R held in the register 1. When the count value $S_3$ of the up-down counter 1 becomes coincident with the reference value R of the register 2, the comparator 2 generate a coincidence signal $S_4$. In this embodiment, the up-down counter 1 is so constructed not to count up beyond a count value corresponding to the reference value R.

The underflow signal $S_5$ and the coincidence signal $S_4$ are supplied to a reset input R and a set input S of a RS (reset-set) flipflop 7, respectively. Therefore, when the coincidence signal $S_4$ is generated, the RS flipflop is set to output a Q output signal $S_6$ of a high level, and when the underflow signal $S_5$ is generated, the RS flipflop is reset to output the Q output signal $S_6$ of a low level. This Q output signal $S_6$ is outputted as a read-out signal.

Now, an operation of the input signal reading circuit shown in FIG. 3 will be described with reference to the timing chart of FIG. 4.

If the input signal $S_1$ is brought to the high level at a time $t_1$, the up-down counter starts to count up. At a time $t_2$, a noise is mixed into the input signal, and the input signal $S_1$ is brought to the low level, with the result that the up-down counter 1 starts to count down. At a time $t_3$, the noise disappears, and therefore, the input signal $S_1$ is brought to the high level again, so that the up-down counter starts to count up again. At a time $t_4$, the count value $S_3$ of the up-down counter 1 becomes coincident with the reference value R of the reference value register 2, and the coincidence signal $S_4$ is generated in the comparator 3, so that the RS flipflop 4 is set to bring the read-out output signal $S_6$ into the high level. Namely, the read-out output signal $S_6$ rises up. At a time $t_5$, the input signal $S_1$ is brought to the low level, and the up-down counter 1 starts to count down from the reference value R. The count value $S_3$ of the up-down counter 1 becomes 0 (zero) at a time $t_6$, and the up-down counter 1 outputs the underflow signal $S_5$, with the result that the RS flipflop 4 is reset to bring the read-out output signal $S_6$ into the low level. Namely, the read-out output signal $S_6$ falls down.

Figure 1:
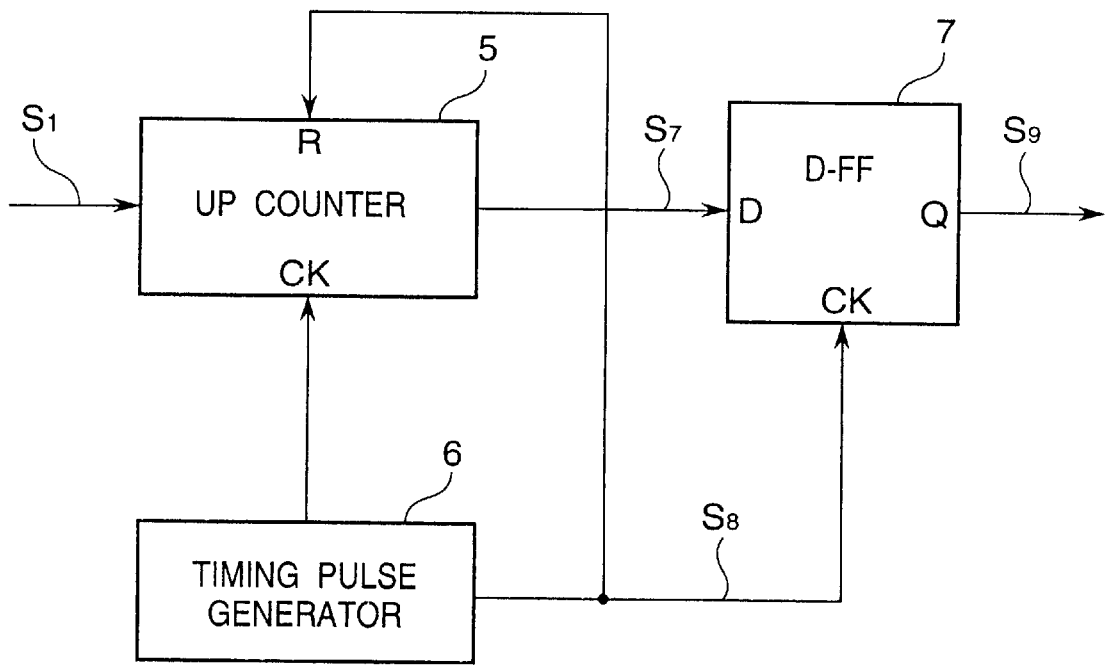
FIG. 1 is a block diagram of one prior art input signal reading circuit.
Figure 2:
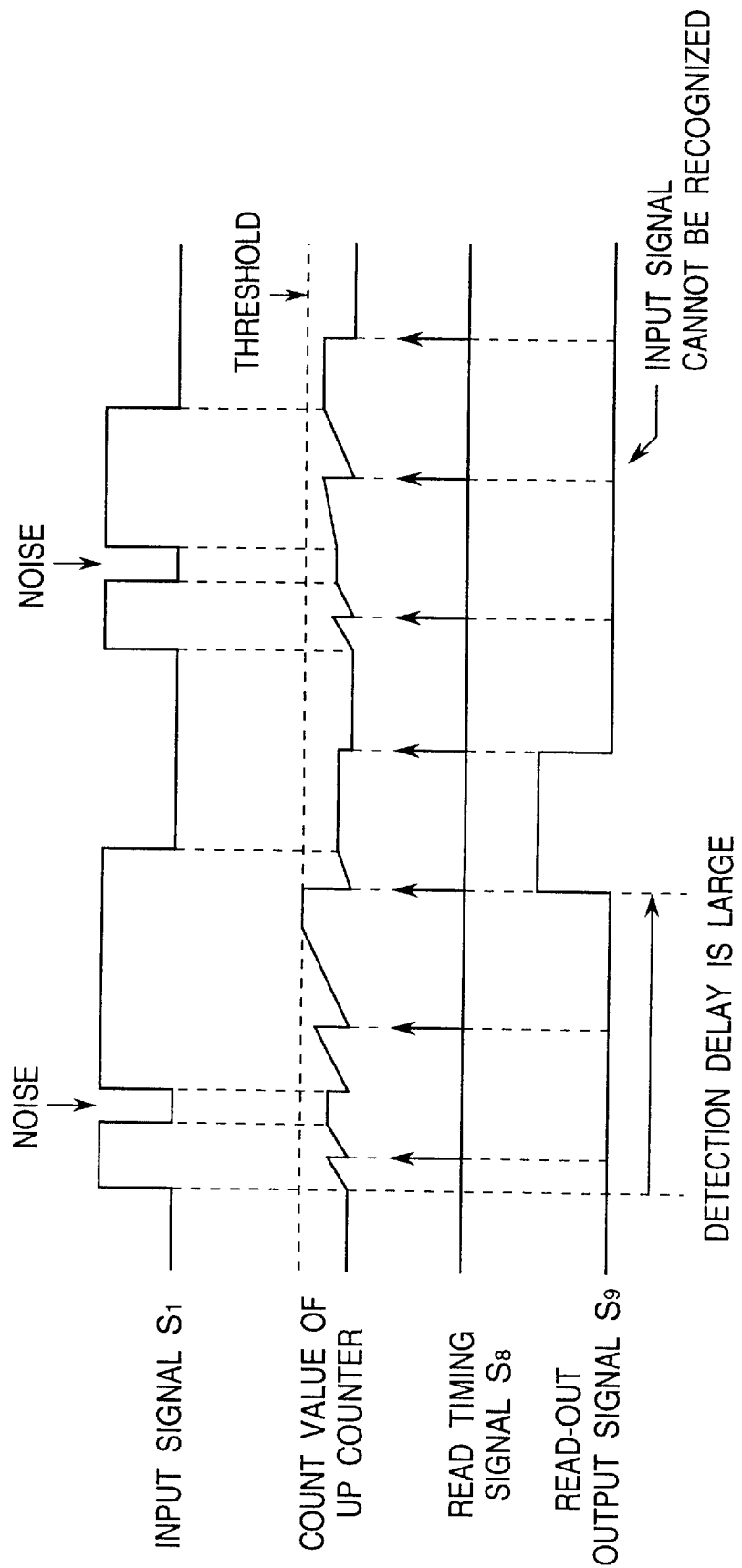
FIG. 2 is a timing chart illustrating an operation of the prior art input signal reading circuit shown in FIG. 2.

Accordingly, an input signal corresponding to one obtained by subtracting the noise from the input signal from the time $t_1$ to the time $t_5$, is read out as the read-out output signal $S_6$, with a delay time which is shorter than that in the prior art example shown in FIG. 1. In addition, since the read-out output signal $S_6$ is brought into the high level as soon as the count value $S_3$ of the up-down counter 1 becomes coincident with the reference value R of the reference value register 2, it is no longer necessary to wait for generation of the read timing clock which was required in the prior art input signal reading circuit shown in FIG. 1 after the counter has reached the predetermined value. Therefore, it is possible to minimize the possibility that the input signal cannot be recognized as in the right half of FIG. 2.

Thereafter, the input signal having removed the noise can be similarly obtained as the read-out output signal $S_6$, as shown in FIG. 4.

Thus, a noisy input signal can be stably read with a small amount of delay and a high degree of fidelity.

Figure 5:
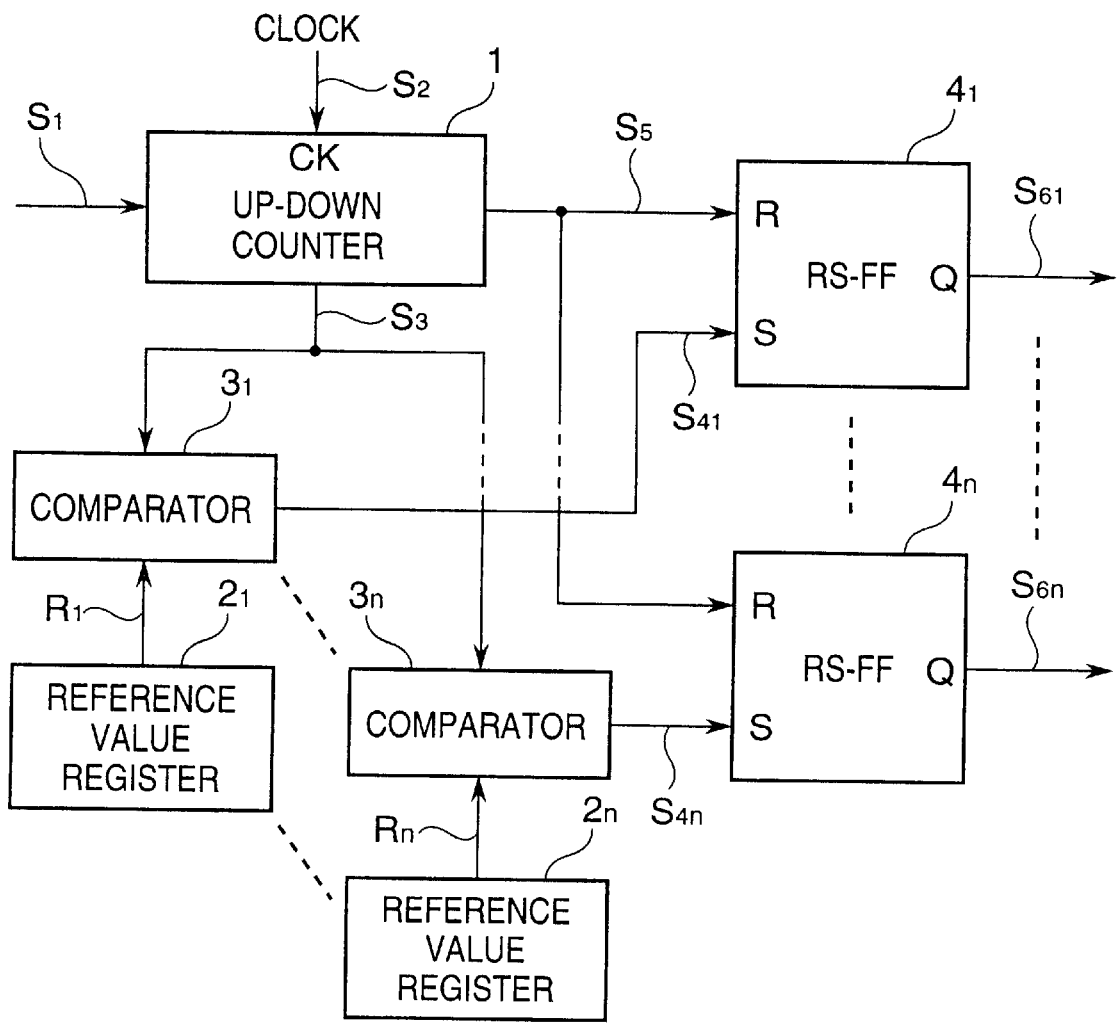
FIG. 5 is a block diagram of a second embodiment of the input signal reading circuit in accordance with the present invention.

Referring to FIG. 5, there is shown a block diagram of a second embodiment of the input signal reading circuit in accordance with the present invention. In FIG. 5, elements similar to those shown in FIG. 3 are given the same Reference Numerals, and explanation thereof will be omitted for simplification of description.

As seen from comparison between FIG. 3 and FIG. 5, the second embodiment is characterized in that the input signal reading circuit includes "n" reference value registers $2_1, \ldots, 2_n$, where "n" is an integer not less than 2, "n" comparators $3_1, \ldots, 3_n$, and "n" RS flipflops $4_1, \ldots, 4_n$.

The reference value registers $2_1, \ldots, 2_n$ hold reference values $R_1, \ldots, R_n$, respectively, where $R_1 < \ldots < R_n$. In this embodiment, the up-down counter 1 is so constructed not to count up beyond a count value corresponding to a maximum reference value $R_n$.

Each of the comparators $3_1, \ldots, 3_n$ receives the count value $S_3$ of the up-down counter 1 in common, and also receives the reference value from a corresponding register. Therefore, the comparators $3_1$ receives the reference value $R_1$ from the corresponding register $2_1$, and the comparators $3_n$ receives the reference value $R_n$ from the corresponding register $2_n$. The comparators $3_1, \ldots, 3_n$ output their coincidence signals $S4_1, \ldots, S_{4n}$ to a set input S of the RS flipflops $4_1, \ldots, 4_n$, respectively. Similarly to the first embodiment, each of the comparators $3_1, \ldots, 3_n$ generates the coincidence signal $S_{41}, \ldots,$ or $S_{4n}$ when the count value $S_3$ of the up-down counter 1 becomes coincident with the reference value $R_1, \ldots,$ or $R_n$ of the corresponding register $2_1, \ldots,$ or $2_n$.

A reset input R of the RS flipflops $4_1, \ldots, 4_n$ receive the underflow signal $S_5$ from the up-down counter 1. The RS flipflops $4_1, \ldots, 4_n$ outputs their Q output signals as read-out output signals $S_{61}, \ldots, S_{6n}$, respectively.

Figure 6:
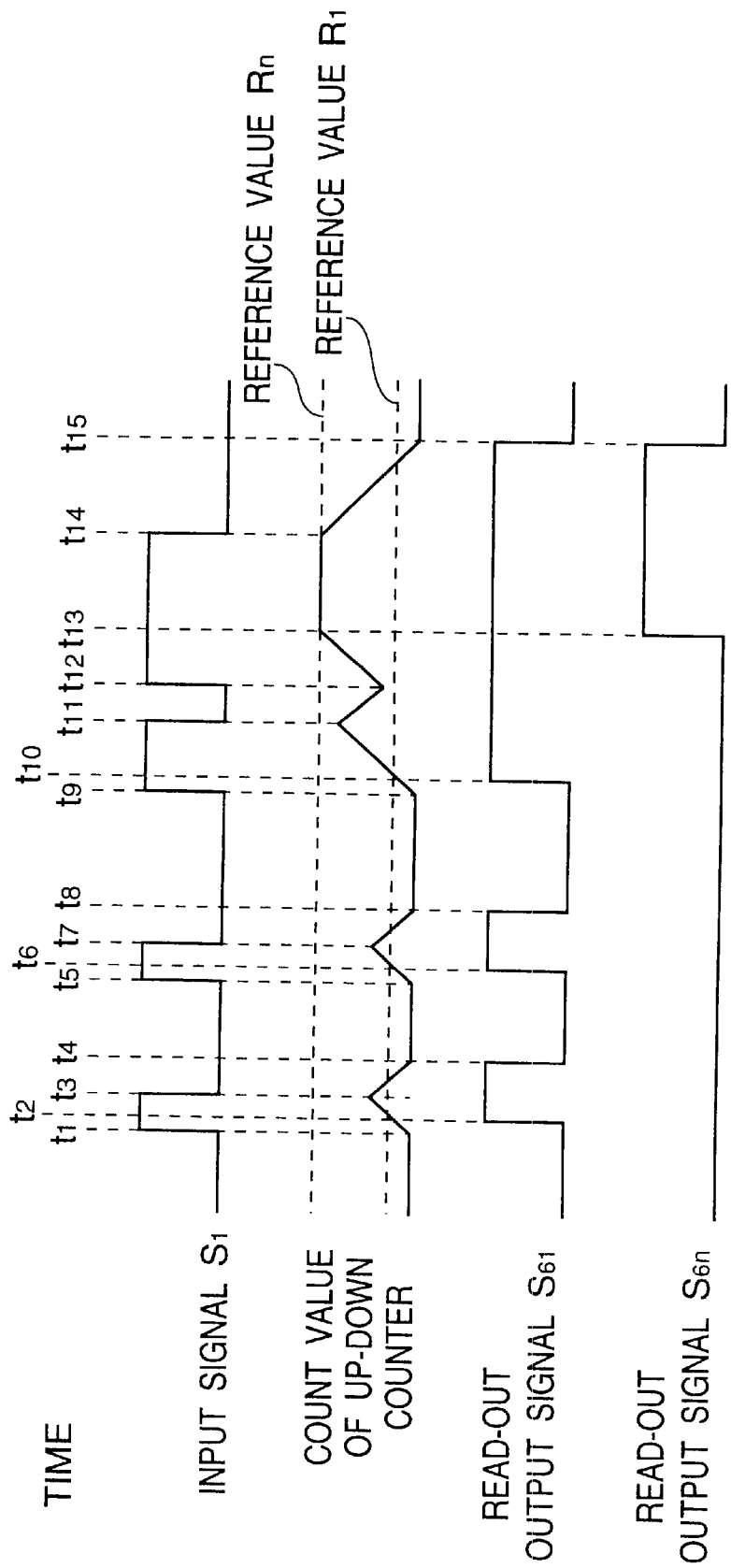
FIG. 6 is a timing chart illustrating an operation of the input signal reading circuit shown in FIG. 5.

Now, an operation of the input signal reading circuit shown in FIG. 5 will be described with reference to the timing chart of FIG. 6.

If the input signal $S_1$ rises up at a time $t_1$, the up-down counter starts to count up. At a time $t_2$, the count value $S_3$ of the up-down counter 1 becomes coincident with the reference value $R_1$ of the reference value register $2_1$, and the read-out output signal $S_{61}$ rises up. At a time $t_3$, the input signal $S_1$ falls down, with the result that the up-down counter 1 starts to count down. At a time $t_4$, the count value $S_3$ of the up-down counter 1 becomes 0 (zero) and the read-out output signal $S_{61}$ falls down. Namely, the read-out output signal $S_{61}$ corresponding to the input signal $S_1$ having the high level from the time $t_1$ to the time $t_3$, is outputted from the time $t_2$ to the time $t_4$. Similarly, the read-out output signal $S_{61}$ corresponding to the input signal $S_1$ having the high level from a time $t_5$ to a time $t_7$, is outputted from a time $t_6$ to a time $t_8$.

If the input signal $S_1$ rises up at a time $t_9$, and falls down at a time $t_{11}$, then, rises up at a time $t_{l2}$, and falls down at a time $t_{l4}$, the read-out output signal $S_{61}$ rises up at a time $t_{10}$, and the read-out output signal $S_{6n}$ rises up at a time $t_{l3}$. Then, the read-out output signals $S_{61}$ and $S_{6n}$ fall down at a time $t_{15}$. Thus, all of the read-out output signals $S_{61}, \ldots, S_{6n}$ are outputted.

In this second embodiment, an arbitrary signal component can be obtained from one input signal by selecting a desired one of the read-out output signals $S_{61}, \ldots, S_{6n}$.

The invention has thus been shown and described with reference to the specific embodiments. However, it should be noted that the present invention is in no way limited to the details of the illustrated structures but changes and modifications may be made within the scope of the appended claims.

I claim:

1. An input signal reading circuit comprising an up-down counter receiving an input signal and a sampling clock to count up said sampling clock when said input signal is at an active level and to count down said sampling clock when said input signal is at an inactive level, said up-down counter outputting an underflow signal when a count value of said up-down counter becomes an initial value;

a register for holding a reference value;

a comparator comparing said count value of said up-down counter with said reference value of said register, to generate a coincidence signal when said count value of said up-down counter becomes coincident with said reference value of said register; and an output circuit receiving said underflow signal and said coincidence signal for outputting a read-out signal, said output circuit responding to said coincidence signal to bring said read-out signal into a first level and responding to said underflow signal to bring said read-out signal into a second level different from said first level.

2. An input signal reading circuit claimed in claim 1 wherein said output circuit is formed of a reset-set flipflop which is set by said coincidence signal to bring a Q output signal into a high level, and is reset by said underflow signal to bring said Q output signal into a low level, said Q output signal constituting said read-out signal.

3. An input signal reading circuit claimed in claim 1 further including "n" registers for holding "n" different reference values, respectively, where "n" is an integer not less than 2;

"n" comparators each comparing said count value of said up-down counter with said reference value of a corresponding one of said "n" registers, to generate a coincidence signal when said count value of said up-down counter becomes coincident with said reference value of said corresponding one of said "n" registers; and "n" output circuits each receiving said underflow signal and said coincidence signal of a corresponding one of said "n" comparators, for outputting a different read-out signal, each of said "n" output circuits responding to said coincidence signal of said corresponding one of said "n" comparators, to bring its read-out signal into said first level and responding to said underflow signal to bring its read-out signal into said second level.

4. An input signal reading circuit claimed in claim 3 wherein each of said output circuits is formed of a reset-set flipflop which is set by said coincidence signal of said corresponding one of said "n" comparators, to bring its Q output signal into a high level, and is reset by said underflow signal to bring its Q output signal into a low level, said Q output signal constituting said read-out signal.

* * * * *

UNITED STATES PATENT AND TRADEMARK OFFICE
CERTIFICATE OF CORRECTION

PATENT NO. : 6,008,672
DATED : Deceember 28, 1999
INVENTOR(S) : Shinichi Suto

It is certified that error appears in the above-identified patent and that said Letters Patent is hereby corrected as shown below:

On The Title Page, [56] References Cited, FOREIGN PATENT DOCUMENTS: Insert

--61-042997 9/1986 Japan--

Signed and Sealed this

Twenty-third Day of January, 2001

Attest:

Q. TODD DICKINSON

*Attesting Officer*       Commissioner of Patents and Trademarks